United States Patent
Tiruvallur et al.

(10) Patent No.: US 7,783,809 B2
(45) Date of Patent: Aug. 24, 2010

(54) VIRTUALIZATION OF PIN FUNCTIONALITY IN A POINT-TO-POINT INTERFACE

(75) Inventors: Keshavan K. Tiruvallur, Tigard, OR (US); David I. Poisner, Folsom, CA (US); Herbert H. J. Hum, Portland, OR (US); Frank Binns, Hillsboro, OR (US); David L. Hill, Cornelius, OR (US); Robert J. Greiner, Beaverton, OR (US); Raymond S. Tetrick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 887 days.

(21) Appl. No.: 11/173,643

(22) Filed: Jun. 30, 2005

(65) Prior Publication Data

US 2007/0002760 A1    Jan. 4, 2007

(51) Int. Cl.
*G06F 13/24* (2006.01)
*G06F 13/32* (2006.01)

(52) U.S. Cl. ...................... 710/268; 710/260
(58) Field of Classification Search ................. 710/268
See application file for complete search history.

(56) References Cited

U.S. PATENT DOCUMENTS

| | | | |
|---|---|---|---|
| 5,555,420 A * | 9/1996 | Sarangdhar et al. | 710/266 |
| 6,219,741 B1 * | 4/2001 | Pawlowski et al. | 710/260 |
| 6,295,573 B1 * | 9/2001 | Bailey et al. | 710/260 |
| 6,470,408 B1 * | 10/2002 | Morrison et al. | 710/268 |
| 7,039,047 B1 * | 5/2006 | Ajanovic et al. | 370/389 |
| 7,051,137 B2 | 5/2006 | Poisner | |
| 2004/0088460 A1 * | 5/2004 | Poisner | 710/260 |
| 2005/0033895 A1 * | 2/2005 | Lueck et al. | 710/311 |
| 2006/0242343 A1 * | 10/2006 | Hsu et al. | 710/266 |

OTHER PUBLICATIONS

PCI Special Interest Group; "PCI Express Base Specification Revision 1.0"; PCI Special Interest Group; Apr. 29, 2002; Revision 1.0; all pages.*

* cited by examiner

*Primary Examiner*—Ryan M Stiglic
(74) *Attorney, Agent, or Firm*—Blakely, Sokoloff, Taylor & Zafman LLP

(57) ABSTRACT

Architectures and techniques that allow legacy pin functionality to be replaced with a "virtual wire" that may communicate information that would otherwise be communicated by a wired interface. A message may be passed between a system controller and a processor that includes a virtual wire value and a virtual wire change indicator. The virtual wire value may include a signal corresponding to one or more pins that have been eliminated from the physical interface and the virtual wire change value may include an indication of whether the virtual wire value has changed. The combination of the virtual wire value and the virtual wire change indicator may allow multiple physical pins to be replaced by message values.

24 Claims, 3 Drawing Sheets

VIRTUALIZATION OF PIN FUNCTIONALITY IN A POINT-TO-POINT INTERFACE

TECHNICAL FIELD

Embodiments of the invention relate to electronic processing systems. More particularly, embodiments of the invention relate to techniques for reduction in overall pin count via virtualization of pin functionality.

BACKGROUND

As generations of processors and other integrated circuit devices have built upon previous generations, the numbers of pins required have generally increased. Even when pins are no longer used they are typically retained for backwards compatibility purposes. However, this may increase the cost and complexity of successive generations.

For example, increased pin count increases the size of an integrated circuit, which may increase manufacturing costs. Routing of signals, both within the integrated circuit and on the host circuit board, may increase in complexity as the result of increased pin count, which may increase cost and/or design time. Other disadvantages may include timing and signal integrity problems, power plane and termination complexities and voltage incompatibilities.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein are architectures and techniques that allow legacy pin functionality to be replaced with a "virtual wire" that may communicate information that would otherwise be communicated by a wired interface. As used herein the term "pin" generically refers to any type of physical connection between an integrated circuit on a die and any external component including, for example, a pin, a bump, a ball, etc.

In one embodiment, a message may be passed between a system controller and a processor that includes a virtual wire value and a virtual wire change indicator. The virtual wire value may include a signal corresponding to one or more pins that have been eliminated from the physical interface and the virtual wire change value may include an indication of whether the virtual wire value has changed. The combination of the virtual wire value and the virtual wire change indicator may allow multiple physical pins to be replaced by message values.

Figure 1:
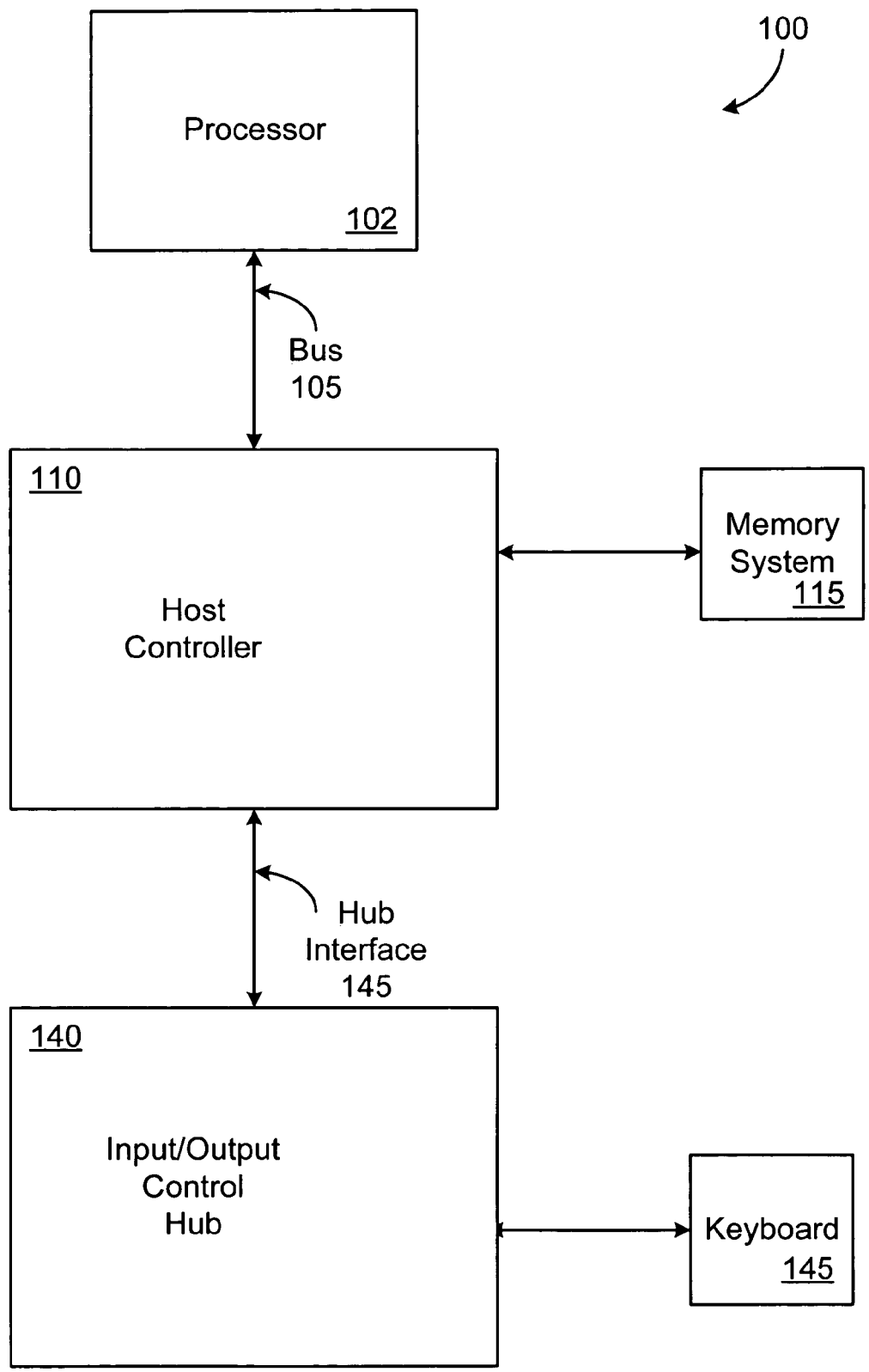
FIG. 1 is a block diagram of one embodiment of an electronic system.

The examples herein are generally directed to computer systems; however, the techniques described can be applied to other devices including, for example, personal digital assistants (PDAs), etc. FIG. 1 is a block diagram of one embodiment of an electronic system. Electronic system 100 includes processor 102 coupled to bus 105. Host controller 110 is also coupled to the bus 105. Host controller 110 may be coupled with memory system 115 that may store data and instructions that are executed by processor 102 or any other device included in electronic system 100.

In one embodiment, memory system 115 includes dynamic random access memory (DRAM); however, memory system 115 may be implemented using other memory types, for example, static random access memory (SRAM), or other configurations of integration, for example processor including memory controller. Additional devices not included in FIG. 1 may also be coupled to bus 105 and/or Host controller 110. Host controller 110 may also include, for example, a graphics interface coupled to a graphics device.

Host controller 110 may further coupled to input/output control hub (ICH) 140, which provides an interface to input/output (I/O) devices. ICH 140 may be coupled to, for example, a Peripheral Component Interconnect (PCI) bus adhering to a Specification Revision 2.1 bus developed by the PCI Special Interest Group of Portland, Oreg. Thus, in one embodiment, ICH 140 includes a PCI bridge that provides an interface to a PCI bus. The PCI bridge provides a data path between processor 102 and peripheral devices. In another embodiment host controller 110 and ICH 140 are integrated together and also include PCI or other device/bridge function.

In addition, other and/or different peripheral devices may also be coupled to ICH 140 in various embodiments. For example, such peripheral devices may include integrated drive electronics (IDE) or small computer system interface (SCSI) hard drive(s), universal serial bus (USB) port(s), keyboard 145, a mouse, parallel port(s), serial port(s), floppy disk drive(s), digital output support (e.g., digital video interface (DVI)), and the like.

Figure 2:
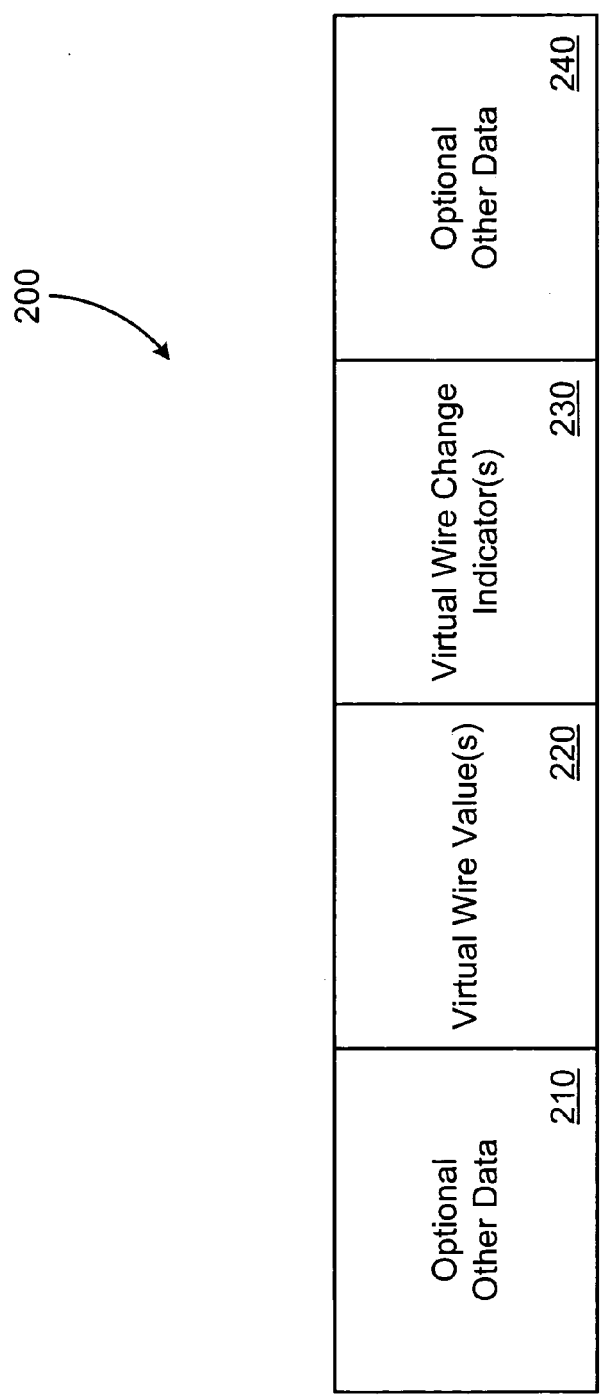
FIG. 2 is a conceptual illustration of one embodiment of a message format that may include a virtual wire value and a virtual wire change indicator.

FIG. 2 is a conceptual illustration of one embodiment of a message format that may include a virtual wire value and a virtual wire change indicator. The message may include information in addition to the virtual wire value and the virtual wire change indicator as indicated by optional other data 210 and optional other data 240. This optional other data may include, for example, error correction/parity bits, message types, source and/or destination identifiers, packet type, addresses, acknowledgement data, routing data, transaction identifiers, etc.

In one embodiment, message 200 may include an address/identifier field that may be used in a multiprocessor system to indicate whether the message is a global message for all processors or intended for a single processor. In one embodiment, a predetermined value (e.g., all 1s, all 0s) may be used to indicate the message is a global message and a processor identifier may be used to cause the message to be sent to a specific processor. In one embodiment, a single package may include multiple processors or processor cores that may have different processor identifiers.

In one embodiment, virtual wire value(s) 220 may be a field in message 200 that includes one bit for each pin, or virtual wire, that is represented by the message. In one embodiment, virtual wire value(s) 220 include ten bits corresponding to ten virtual wires, or ten pins on a legacy device. In alternate embodiments, virtual wire value(s) 220 may include more or less than ten bits.

In one embodiment, virtual wire value(s) 220 represent the following ten pins from Intel Architecture processors: INTR/

LINT0, NMI/LINT1, SMI#, INIT#, FERR#, IGNNE#, STP-CLK#, PROCHOT#, A20M#, and CPU_SCI. In alternate embodiments, other signals may be represented and other processor architectures may also be supported. In one embodiment, the status of each bit in virtual wire value(s) 220 corresponds to a state (e.g., high/low) of the corresponding pin if that pin were to be included in the interface.

INTR/LINT0 indicates to the processor that an 8259 interrupt is active/inactive. NMI/LINT1 indicates that a non-maskable interrupt (NMI) occurred. SMI# indicates to the processor that a System Management Interrupt (SMI) occurred. INIT# indicates to the processor that it is to initialize. FERR# indicates to the chipset that the processor has detected a floating-point error. IGNNE# causes to the processor that it is to ignore the number error. STPCLK# causes the processor to halt instruction execution and to enter a stop grant (snoopable) state. PROCHOT# may be used to indicate that the processor has exceeded a thermal limit. In some processors the PROCHOT# signal can also be used as an input to force throttling. PROCHOT# may also be a bi-directional signal. For example, PROCHOT# may be used by controller to force throttling by the processor and/or the processor may use PROCHOT# to indicate an elevated processor temperature. A20M# indicates that the A20 signal should be masked/unmasked. CPU_SCI allows the processor to set a GPE bit in the chipset's ACPI space and thus cause an SCI.

In one embodiment, virtual wire change indicator(s) 230 include the same number of bits as virtual wire value(s) 220. Each bit may indicate whether the corresponding virtual wire value has been changed by the current message. For example, if the first bit of virtual wire value(s) 220 is used for NMI signaling, a value of 0 in may indicate that the NMI pin would not be asserted if it were included in the wired interface and a value of 1 may indicate that the NMI pin would be asserted. A value of 0 in the first bit of virtual wire change indicator(s) 230 may indicate that the NMI signal has not changed while a value of 1 in the first bit may indicate that the NMI signal has been changed by the current message.

Using the messages set forth above, the value of a pin may be indicated through fields in a message rather than through dedicated wired interfaces. This may allow the pin count of an integrated circuit to be reduced, which may result in a less expensive and/or less complex system. Any type of interface between system components may be supported including, for example, various bus protocols and configurations as well as optical communications.

Referring back to FIG. 1, the message described with respect to FIG. 2 may be used to communicate virtual pin (and optionally additional) information between ICH 140 and processor 102 via host controller 110. In one embodiment, the messages are carried by hub interface 145 and from ICH 140 to host controller 110 and by bus 105 from host controller 110 to processor 105. In alternate embodiments, other configurations may also be supported. For example, ICH 140 and host controller 110 may be implemented as a single integrated circuit device and the message may be passed from the combined ICH/host controller to processor 102 via bus 105 or by another wired interface.

When a message is received by either processor 102 or ICH 140 indicating a change in a virtual wire value, the receiving entity may respond in the manner defined by the architecture that is being supported. For example, if processor 102 receives an indication that the NMI signal has been asserted via a message as described above, processor 102 may process the interrupt as did previous generation processors that included a dedicated NMI pin. Similarly, if ICH 140 receives an indication that the PROCHOT# signal has been asserted via a message, ICH 140 may respond in any appropriate manner.

Figure 3:
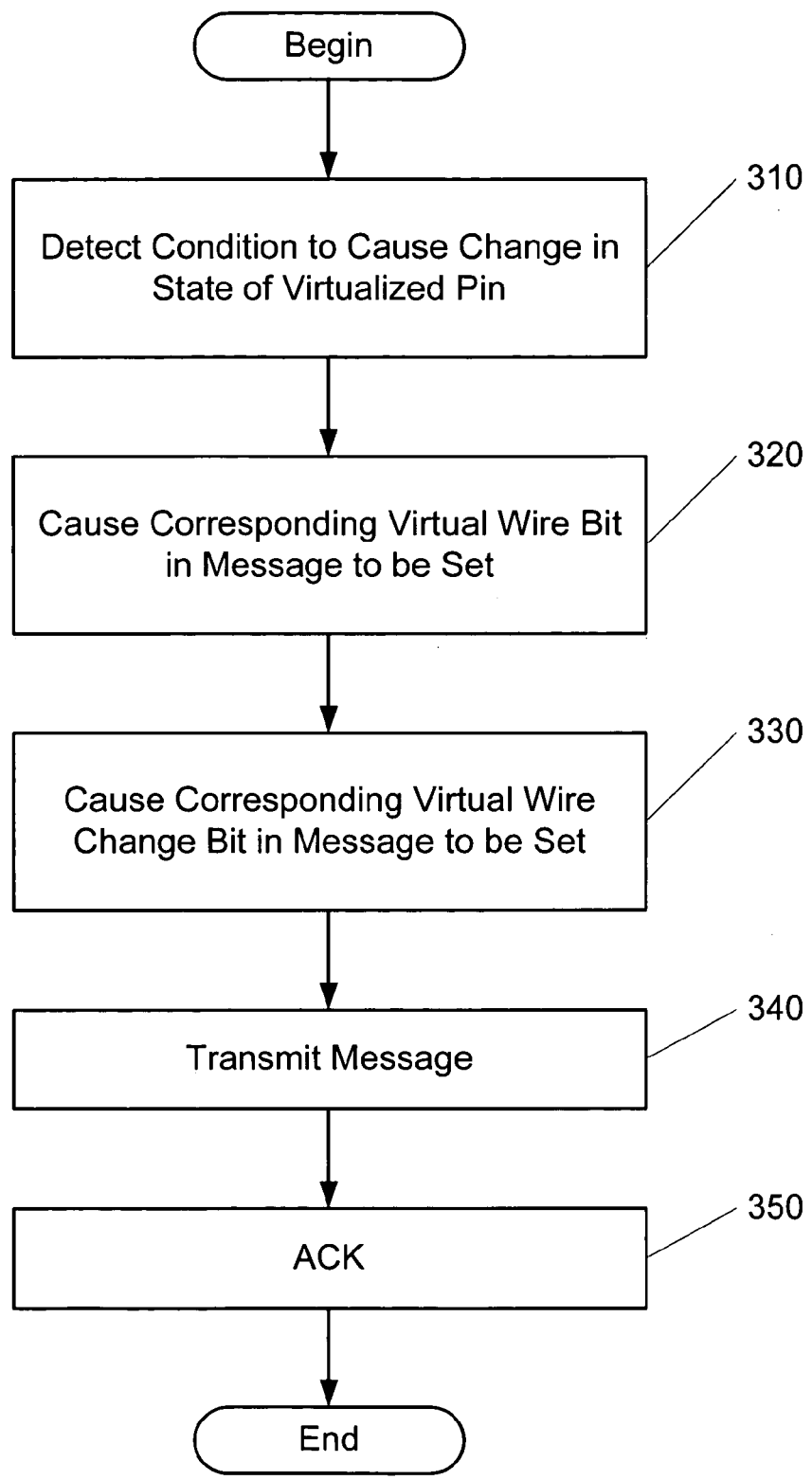
FIG. 3 is a flow diagram of one embodiment of communication of information using virtualized pins.

FIG. 3 is a flow diagram of one embodiment of communication of information using virtualized pins. The process of FIG. 3 may be performed, for example, by an input/output controller that generates a message to be communicated to a processor. Other devices and/or components of an electronic system may similarly perform the process of FIG. 3 to support virtualized pins.

A condition that may cause a change in the state of a pin may be detected, 310. The condition may be any condition that would cause the state of the pin to be changed if the pin were included in the physical interface of the source device. As discussed above, various processor and/or chip set architectures may have defined a specific functionality for a pin that was previously included in a physical interface that may be replaced by a virtual wire signaling as described herein.

In response to detecting the condition, the bit in the virtual wire value(s) corresponding to the condition may be changed, 320. In one embodiment, the bit in the virtual wire change indicator(s) corresponding to the bit in the virtual wire value(s) may be set to indicate a change in the virtual wire value(s), 330. This may allow the virtual wire value to remain unchanged through a sequence of multiple messages without the need to compare multiple messages to detect a change.

When the appropriate bits are set, the message may be transmitted, 340, for example from a chip set component to a processor. In response to transmission of the message, an acknowledgement may be received, 350. The acknowledgement may be in the form of a return message having the same or similar format as the transmitted message or the acknowledgement may take a different form, for example, a single signal or a message with a different format.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    transmitting from an input/output control hub (ICH) to one or more destination processors via a host controller a first set of one or more bits each of which correspond to a pin defined to provide the functionality not included in a physical interface of the ICH, wherein the first set of bits are included in a first message also having a first field to indicate whether the message is directed to a selected destination processor or to all of the one or more destination processors;
    transmitting from the ICH to the selected processor or all of the one or more destination processors second set of one or more bits each of which correspond to a change in a respective bit in the first set of one or more bits; and
    receiving, with the ICH, one or more acknowledgement messages from the selected processor or all of the one or more destination processors that acknowledge receiving the second set of one or more bits, wherein the one or more acknowledgement messages indicate that the one or more destination processors have asserted a signal of a corresponding pin not included in the physical interface of the ICH.

2. The method of claim 1 wherein the one or more destination electronic system components comprises at least a processor.

3. The method of claim 1 wherein the one or more destination electronic system components comprises at least a processor having an integrated memory controller.

4. The method of claim 1 wherein the one or more destination electronic system components comprises at least multiple processing cores in a single package.

5. The method of claim 1 wherein the one or more destination electronic system components comprises at least multiple processing cores in multiple packages.

6. The method of claim 1 wherein the one or more destination electronic system components comprises at least an input/output controller.

7. The method of claim 1 wherein the source electronic system component comprises a processor.

8. The method of claim 1 wherein the first set of bits and the second set of bits are transmitted in a single message from the source electronic system component to the destination electronic system component.

9. The method of claim 1 wherein the first set of bits correspond to one or more of: INTR/LINT0, NMI/LINT1, SMI#, INIT#, FERR#, IGNNE#, STPCLK#, PROCHOT#, A20M#, and CPU_SCI as defined by the Intel Architecture (IA-32).

10. An apparatus comprising:
an input/output control hub (ICH) having a physical interface to transmit a message that includes a first set of one or more bits each of which correspond to a pin defined to provide the functionality not included in the physical interface of the ICH and second set of one or more bits each of which correspond to a change in a respective bit in the first set of one or more bits, wherein the message further comprises a first field to indicate whether the message is directed to a selected destination processor or is a global message; and
a destination processor coupled with the physical interface of the ICH via a host controller that analyzes the message to interpret the first set of bits and the second set of bits to determine whether one of the first set of bits is changed by the message and to perform a specified action in response to a change in one of the first bits and sends one or more acknowledgement messages from the selected processor or all of the one or more destination processors that acknowledge receiving the second set of one or more bits, wherein the one or more acknowledgement messages indicate that the one or more destination processors have asserted a signal of a corresponding pin not included in the physical interface of the ICH.

11. The apparatus of claim 10 wherein the destination component comprises a processor.

12. The apparatus of claim 11 wherein the destination electronic system component comprises a processor having an integrated memory controller.

13. The apparatus of claim 11 wherein the destination electronic system component comprises multiple processing cores in a single package.

14. The apparatus of claim 11 wherein the destination electronic system component comprises multiple processing cores in multiple packages.

15. The apparatus of claim 10 wherein the source component comprises an input/output controller.

16. The apparatus of claim 10 wherein the source electronic system component comprises a processor.

17. The apparatus of claim 10 wherein the first set of bits correspond to one or more of: INTR/LINT0, NMI/LINT1, SMI#, INIT#, FERR#, IGNNE#, STPCLK#, PROCHOT#, A20M#, and CPU_SCI as defined by the Intel Architecture (IA-32).

18. A system comprising:
an input/output control hub (ICH) having a physical interface to transmit a message that includes a first set of one or more bits each of which correspond to a pin defined to provide the functionality not included in the physical interface of the ICH and second set of one or more bits each of which correspond to a change in a respective bit in the first set of one or more bits, wherein the message further comprises a first field to indicate whether the message is directed to a selected destination processor or is a global message; and
a keyboard coupled with the source component; and
a destination processor coupled with the physical interface of the ICH via a host controller that analyzes the message to interpret the first set of bits and the second set of bits to determine whether one of the first set of bits is changed by the message and to perform a specified action in response to a change in one of the first bits and sends one or more acknowledgement messages from the selected processor or all of the one or more destination processors that acknowledge receiving the second set of one or more bits, wherein the one or more acknowledgement messages indicate that the one or more destination processors have asserted a signal of a corresponding pin not included in the physical interface of the ICH.

19. The system of claim 18 wherein the destination component comprises a processor.

20. The system of claim 18 wherein the destination electronic system component comprises a processor having an integrated memory controller.

21. The system of claim 18 wherein the destination electronic system component comprises multiple processing cores in a single package.

22. The system of claim 18 wherein the source component comprises an input/output controller.

23. The system of claim 18 wherein the source electronic system component comprises a processor.

24. The system of claim 18 wherein the first set of bits correspond to one or more of: INTR/LINT0, NMI/LINT1, SMI#, INIT#, FERR#, IGNNE#, STPCLK#, PROCHOT#, A20M#, and CPU_SCI as defined by the Intel Architecture (IA-32).

* * * * *